United States Patent
Zo et al.

(10) Patent No.: US 11,518,683 B2
(45) Date of Patent: Dec. 6, 2022

(54) METHOD AND APPARATUS FOR PREPARING BORON NITRIDE NANOTUBES BY HEAT TREATING BORON PRECURSOR PREPARED BY USING AIR-JET

(71) Applicant: NAiEEL Technology, Daejeon (KR)

(72) Inventors: Min Kyung Zo, Yeongcheon-si (KR); Jaewoo Kim, Daejeon (KR); Duck Bong Seo, Daejeon (KR); Hee Jin Kim, Gyeonggi-do (KR)

(73) Assignee: NAIEEL TECHNOLOGY

( * ) Notice: Subject to any disclaimer, the term of this patent is extended or adjusted under 35 U.S.C. 154(b) by 751 days.

(21) Appl. No.: 16/456,554

(22) Filed: Jun. 28, 2019

(65) Prior Publication Data

US 2019/0337812 A1    Nov. 7, 2019

Related U.S. Application Data

(62) Division of application No. 15/581,713, filed on Apr. 28, 2017, now Pat. No. 10,370,255.

(30) Foreign Application Priority Data

Feb. 2, 2017    (KR) .......................... 10-2017-0014753

(51) Int. Cl.
    *B01J 8/00*    (2006.01)
    *B01J 19/00*   (2006.01)
    (Continued)

(52) U.S. Cl.
    CPC .............. *C01B 35/146* (2013.01); *B01J 8/008* (2013.01); *B01J 8/009* (2013.01); *C01B 21/064* (2013.01);
    (Continued)

(58) Field of Classification Search
    CPC ..... B01J 8/00; B01J 8/008; B01J 8/009; B01J 19/00; B01J 19/24; B01J 2208/00;
    (Continued)

(56) References Cited

U.S. PATENT DOCUMENTS 8,771,524 B2 *  7/2014  Vorage ..................... B01J 19/24
                                                   210/512.1
2011/0251331 A1  10/2011  Mcandrew et al.
(Continued)

FOREIGN PATENT DOCUMENTS

JP    H02-296706    12/1990
JP    2003-117426   4/2003
(Continued)

OTHER PUBLICATIONS

Fabrication of Nanomaterials based on Boron Nitride and Development of Original Technology for Nuclear Applications (Jan. 31, 2013) KAERI/RR-3535/2012; Seonghee Park/Center for Quantum Beam based Radiation Research.

*Primary Examiner* — Natasha E Young
(74) *Attorney, Agent, or Firm* — Sand, Sebolt & Wernow Co., LPA

(57) ABSTRACT

A method and apparatus for preparing boron nitride nanotubes (BNNTs) according to an embodiment may ensure mass-production, may increase yield by reducing a production time, and may prepare BNNTs with high purity.

20 Claims, 13 Drawing Sheets

(51) Int. Cl.
  *B01J 19/24*  (2006.01)
  *C01B 21/064*  (2006.01)
  *C01B 35/14*  (2006.01)
  *C23C 16/34*  (2006.01)
  *C23C 16/44*  (2006.01)

(52) U.S. Cl.
  CPC ........ *C01B 21/0641* (2013.01); *C23C 16/342* (2013.01); *C23C 16/4418* (2013.01); *B01J 2208/00008* (2013.01); *B01J 2208/00017* (2013.01); *C01P 2004/03* (2013.01); *C01P 2004/04* (2013.01); *C01P 2004/13* (2013.01)

(58) Field of Classification Search
  CPC .... B01J 2208/00008; B01J 2208/00017; B01J 2219/00; B01J 2219/24; C01B 21/00; C01B 21/06; C01B 21/064; C01B 21/0641; C01B 35/00; C01B 35/08; C01B 35/014; C01B 35/146; C23C 16/00; C23C 16/22; C23C 16/30; C23C 16/34; C23C 16/342; C23C 16/44; C23C 16/4418
  See application file for complete search history.

(56) References Cited

U.S. PATENT DOCUMENTS

2013/0064750 A1\* 3/2013 Zettl ..................... B01J 19/088
                                                                977/773
2019/0337812 A1    11/2019 Zo et al.

FOREIGN PATENT DOCUMENTS

KR    10-2010-0008125          8/2010
KR    20170016539              2/2017
WO    WO-2016186721 A1 \* 11/2016  ............ B01J 10/005

\* cited by examiner

METHOD AND APPARATUS FOR PREPARING BORON NITRIDE NANOTUBES BY HEAT TREATING BORON PRECURSOR PREPARED BY USING AIR-JET

CROSS-REFERENCE TO RELATED APPLICATIONS

This application is a divisional of U.S. patent application Ser. No. 15/581,713 filed Apr. 28, 2017, now U.S. Pat. No. 10,370,255, which claims the benefit of Korean Patent Application No. 10-2017-0014753, filed on Feb. 2, 2017, in the Korean Intellectual Property Office, the entire disclosures of which are incorporated herein in their entirety by reference.

BACKGROUND

Field

One or more embodiments relate to a method and apparatus for preparing boron nitride nanotubes.

Description of the Related Art

Boron nitride nanotubes (BNNTs) have mechanical properties and thermal conductivity that are similar to those of carbon nanotubes (CNTs) that are generally known. However, CNTs are a combination of conductors and semiconductors and have low thermal and chemical stability due to oxidation at a temperature equal to or higher than about 400° C., whereas BNNTs are electrically insulating with a wide band gap of about 5 eV and are thermally stable at a high temperature equal to or higher than about 800° C. in air. Also, boron in BNNTs has thermal neutron absorption efficiency that is about 200,000 times higher than that of carbon in CNTs, and thus has potential to be a radiation-shielding material.

Technology for mass-producing BNNTs has not been developed yet due to difficulties in a process such as synthesis at a high temperature equal to or higher than 1000° C. Also, it is difficult to increase purity due to impurities and/or unreacted impurities during preparation of BNNTs and an expensive purification process for removing impurities is required.

SUMMARY

One or more embodiments include a method and apparatus for preparing boron nitride nanotubes (BNNTs) that may ensure mass-production and may increase yield by reducing a production time.

One or more embodiments include a method and apparatus for preparing BNNTs with high purity.

Additional aspects will be set forth in part in the description which follows and, in part, will be apparent from the description, or may be learned by practice of the presented embodiments.

According to one or more embodiments, a method of preparing boron nitride nanotubes (BNNTs) includes: forming second powder including a boron precursor by nano-sizing first powder including boron; forming a precursor disk by mixing the second powder with a binder; and growing BNNTs on the precursor disk.

The first powder may further include a catalyst.

The nano-sizing of the first powder may include: applying first air to a nano-sizing area to form an eddy; applying the first powder to the nano-sizing area; and forming the second powder by using the eddy in the nano-sizing area.

The method may further include collecting the second powder included in second air including the second powder in the nano-sizing area.

The growing of the BNNTs on the precursor disk may include: locating the precursor disk in a heating zone of a reaction chamber; heating the heating zone; and applying a reactive gas to the heating zone.

The method may further include: causing a rod to pass through a plurality of the precursor disks; and locating the rod in the heating zone.

According to one or more embodiments, an apparatus for preparing boron nitride nanotubes (BNNTs) includes: a container including a nano-sizing area in which first powder is nano-sized to form second powder, a first inlet through which the first powder is introduced into the nano-sizing area, a second inlet through which first air is introduced to the nano-sizing area, and an outlet through which second air including the second powder is discharged from the nano-sizing area; a first air injector connected to the second inlet and allowing the first air to be introduced into the nano-sizing area therethrough; and a collector connected to the outlet and including a membrane being enable to pass the second air therethrough and collect the second powder.

The apparatus may further include: a reaction chamber being enable to receive a precursor disk formed by mixing the second powder with a binder and including at least a heating zone; a rod passing through the precursor disk; a temperature controller being enable to adjust a temperature of at least the heating zone; a vacuum processor connected to the reaction chamber and being enable to adjust a degree of vacuum in the reaction chamber; a gas supply pipe located in the reaction chamber and being enable to apply a reactive gas to at least the heating zone of the reaction chamber; and a reactive gas supplier connected to the gas supply pipe and being enable to apply the reactive gas to the gas supply pipe.

The apparatus may further include a cassette configured to receive the precursor disk and received in the reaction chamber.

The cassette may include: a pair of supports facing each other; a rod located between the pair of supports and passing through the precursor disk.

According to one or more embodiments, an apparatus of preparing boron nitride nanotubes (BNNTs) includes: a reaction chamber being enable to receive a precursor disk formed by mixing powder including a boron precursor with a binder and including at least a heating zone; a rod passing through the precursor disk; a vacuum processor connected to the reaction chamber and being enable to adjust a degree of vacuum in the reaction chamber; a gas supply pipe located in the reaction chamber and being enable to apply a reactive gas to at least the heating zone of the reaction chamber; and a reactive gas supplier connected to the gas supply pipe and being enable to apply the reactive gas to the gas supply pipe.

The apparatus may further include a cassette configured to receive the precursor disk and received in the reaction chamber.

The cassette may include: a pair of supports facing each other; and a rod located between the pair of supports and passing through the precursor disk.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
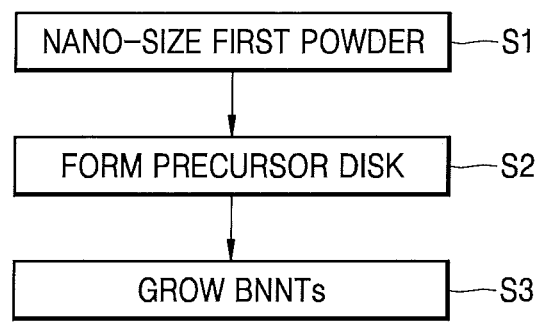
FIG. 1 is a flowchart of a method of preparing boron nitride nanotubes (BNNTs) according to an embodiment.

The present disclosure may include various embodiments and modifications, and embodiments thereof will be illustrated in the drawings and will be described herein in detail. The advantages and features of the present disclosure and methods of achieving the advantages and features will be described more fully with reference to the accompanying drawings, in which embodiments are shown. The present disclosure may, however, be embodied in many different forms and should not be construed as being limited to the embodiments set forth herein.

Reference will now be made in detail to embodiments, examples of which are illustrated in the accompanying drawings. In the drawings, the same elements are denoted by the same reference numerals, and a repeated explanation thereof will not be given.

It will be understood that although the terms "first", "second", etc. may be used herein to describe various elements, these elements should not be limited by these terms. These elements are only used to distinguish one element from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements may be exaggerated for convenience of explanation. In other words, since sizes and thicknesses of elements in the drawings are arbitrarily illustrated for convenience of explanation, the following embodiments are not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be different from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

FIG. 1 is a flowchart of a method of preparing boron nitride nanotubes (BNNTs) according to an embodiment.

Referring to FIG. 1, the method may include nano-sizing first powder 51, forming a precursor disk S2, and growing BNNTs S3.

The nano-sizing of the first powder 51, in which the first powder is nano-sized, may include nano-sizing the first powder and forming second powder including a boron precursor.

The first powder may include boron. The boron may be in a powder state. As a mean diameter of boron powder decreases, the quality of prepared BNNTs may increase. The boron powder may have a diameter ranging from about 0.01 μm to about 0.5 μm.

The boron may be crystalline and/or amorphous boron.

Since crystalline boron is very hard, the crystalline boron may contribute to obtaining catalytic metal particles produced from a container during nano-sizing, specifically, during a nano-sizing process using an eddy of air and obtaining seed precursor nanoparticles with high efficiency when boron with a nano size is coated on or embedded in surfaces of the catalytic metal nanoparticles. However, when crystalline boron is used, it may take a long time to perform nano-sizing and thus it may take a long time to prepare BNNTs, thereby reducing productivity. Also, when crystalline boron is used, too many catalytic metal nanoparticles may be produced and may act as impurities of finally prepared BNNTs, thereby increasing impurity contents and reducing the purity of the BNNTs. Furthermore, an additional sophisticated purification process for reducing the impurities is required, thereby increasing preparation costs.

Accordingly, according to an embodiment, the boron may be amorphous boron, instead of crystalline boron. When amorphous boron is used, boron nanopowder may be obtained even during a short nano-sizing process and BNNTs may be produced in high yield.

The first powder may further comprise a catalyst. The catalyst may be provided in a powder state. The catalyst is more effective for amorphous boron. That is because when amorphous boron is used, unlike in a case where crystalline boron is used in a nano-sizing process using an air jet and/or an eddy of air, catalytic metal nanoparticles may not be produced and many boron nanoparticles may be prepared in a very short time. The catalyst may be combined with boron particles in a process of nano-sizing the first powder to form precursor nanoparticles, and the precursor nanoparticles functioning as a seed during preparation of BNNTs may react with nitrogen to contribute to compounding boron nitride (BN). Catalyst particles may comprise, but are not limited to, iron (Fe), magnesium (Mg), nickel (Ni), chromium (Cr), cobalt (Co), zirconium (Zr), molybdenum (Mo), tungsten (W), and/or titanium (Ti).

A catalytic powder content may range from about 5 wt % to 20 wt % based on 100 wt % of the boron powder. When the catalytic powder content is less than 5 wt %, sufficient catalyst particles needed to prepare BNNTs may not be obtained. When the catalytic powder content is greater than 20 wt %, boron-catalyst particles in a nano-sizing process using an air jet and/or an eddy of air may not be efficiently combined and the catalytic powder may act as impurities. When nano-sizing is performed using the catalytic powder in the above content range, appropriate boron-catalytic nanoparticles may be produced.

According to an embodiment, the nano-sizing of the first powder may further comprise applying first air to a nano-sizing area, applying the first powder to the nano-sizing area, and forming the second powder by using the first air in the nano-sizing area.

Figure 2:
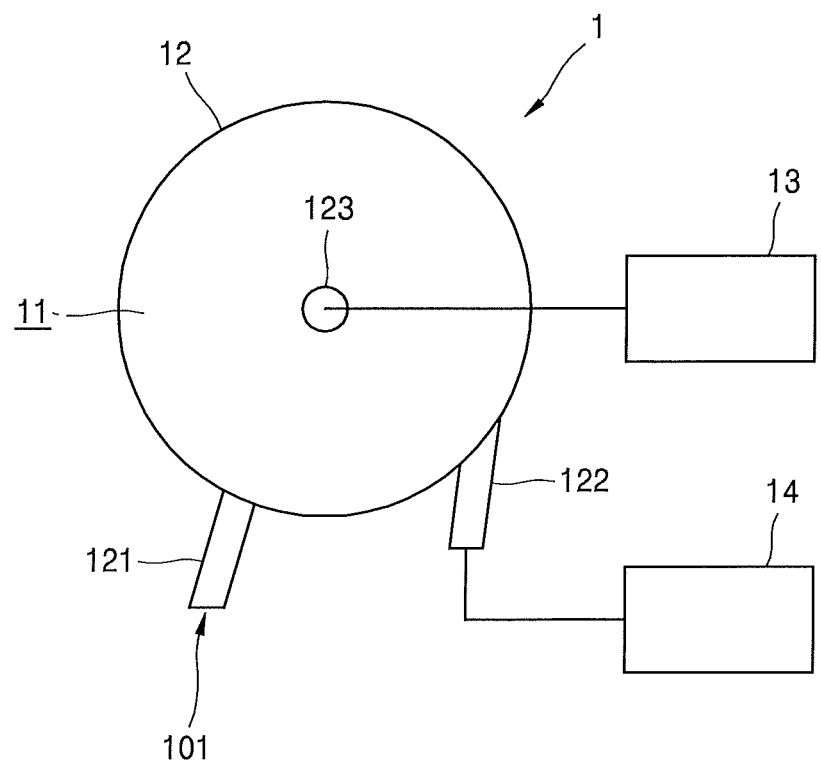
FIG. 2 is a plan view of a first powder nano-sizing apparatus according to an embodiment.

FIG. 2 is a plan view of a first powder nano-sizing apparatus 1 according to an embodiment.

Referring to FIG. 2, the first powder nano-sizing apparatus 1 according to an embodiment may comprise a container 12, a first air injector 14, and a collector 13.

The container 12 may include a nano-sizing area 11, a first inlet 121, a second inlet 122, and an outlet 123.

The nano-sizing area 11 that is located in the container 12 may be an area where first powder is nano-sized and second powder is formed. The nano-sizing area 11 may have a circular shape, as shown in FIG. 2, so that first air introduced from the second inlet 122 may form an eddy in the nano-sizing area 11. Although not shown in FIG. 2, the nano-sizing area 11 may further comprise a structure for more elaborately forming the eddy.

The first inlet 121 is located at a side surface of the container 12 and communicates with the nano-sizing area 11. First powder 101 is introduced through the first inlet 121 into the nano-sizing area 11. The first inlet 121 may be inclined to form an acute angle with respect to a direction in which the first air flows so that the first powder 101 may be applied as the first air flows in the nano-sizing area 11.

The second inlet 122 is located at a side surface of the container 12 and communicates with the nano-sizing area 11. The first air may be introduced through the second inlet 122 into the nano-sizing area 11. The second inlet 122 may be inclined with respect to a normal direction of the container 12 so that the first air may become rotational flow in the nano-sizing area 11.

The second inlet 122 may be connected to the first air injector 14. Although not shown in FIG. 2, the first air injector 14 may comprise a compressed air storage tank and an air pump, and thus the first air that is a compressed high-speed air jet may be injected into the nano-sizing area 11.

The outlet 123 may be located at an upper end portion of the container 12, and communicates with the nano-sizing area 11. Second air may be discharged through the outlet 123 from the nano-sizing area 11. The second air refers to a combination of the first air and the second powder in the nano-sizing area 11. Although not shown in FIG. 2, the outlet 123 may further include a gate. The second air may be discharged to the collector 13 by opening the gate when nano-sizing ends.

According to an embodiment, the first powder may be nano-sized due to the first air that rotates at a high speed in the nano-sizing area 11. The first powder may be a combination of boron powder and catalytic powder, as described above. When the boron powder is embedded in an optimal amount of catalytic powder as nano-sizing is performed in the nano-sizing area 11, an optimal condition and/or particle size for BNNT synthesis and growth may be provided.

According to a more detailed embodiment, the nano-sizing of the first powder may further comprise collecting the second powder included in the second air in the nano-sizing area 11.

Figure 3:
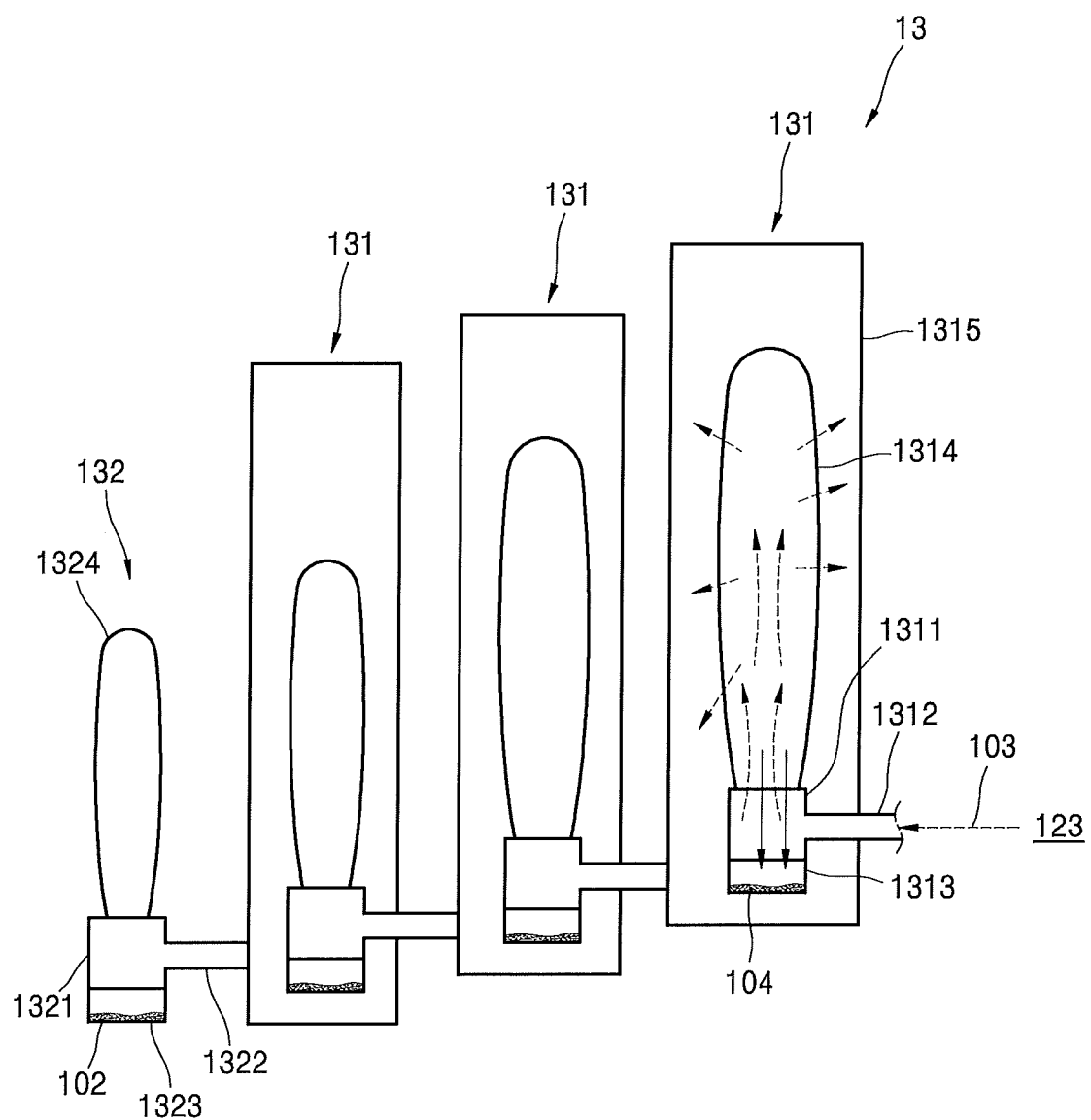
FIG. 3 is a side-sectional view of a collector according to an embodiment.

FIG. 3 is a side-sectional view of the collector 13 according to an embodiment.

The collector 13 may comprise a first collector 131 and a second collector 132. According to an embodiment, a plurality of the first collectors 131 may be provided, and the number of first collectors 131 may be selectively adjusted according to various process conditions such as air pressure and an amount of the boron.

The first collector 131 may comprise a first membrane 1314 through which second air passes, and the second collector 132 may include a second membrane 1324 through which the second air having passed through the first membrane 1314 passes and configured to collect second powder 102.

In detail, the first collector 131 may comprise a first bracket 1311 located in a first collecting container 1315, a first pipe 1312 communicating with the first bracket 1311, the first membrane 1314 connected to the first bracket 1311, and a first receiver 1313 coupled to the first bracket 1311.

The first bracket 1311 may be provided to have a vertical pipe shape, as shown in FIG. 3, and may be connected to the first pipe 1312 at least a side of the first bracket 1311.

The first pipe 1312 is connected to the outlet 123 and receives the second air 103.

The first membrane 1314 may be coupled to an end, for example, an upper end portion, of the first bracket 1311 and may filter the second powder 102 when the second air 103 passes through the first membrane 1314. An air pore size or a density of the first membrane 1314 may be determined based on a desired boron particle size.

The first receiver 1313 may be coupled to the other end, for example, a lower end portion, of the first bracket 1311 and may receive powder filtered by the first membrane 1314. Although not shown in FIG. 3, a filter and/or a mesh may be further provided between the first receiver 1313 and the first bracket 1311 to prevent the powder received in the first receiver 1313 from entering back to the first membrane 1314.

Accordingly, the second air 103 ejected from the outlet 123 flows through the first pipe 1312 to the first membrane 1314, and powder 104 filtered by the first membrane 1314 is received in the first receiver 1313. The second air 103 having passed through the first membrane 1314 is received in the first collecting container 1315.

As a plurality of the first collectors 131 are connected to one another, the first pipe 1312 of one first collector 131 communicates with the first collecting container 1315 of the first collector 131 at a more upstream position, and thus powder of the second air 103 is sequentially filtered. Accordingly, the powder 104 received in the first receiver 1313 at a upstream position has a larger diameter than that received in the first receiver 1313 at a downstream position, and the second powder 102 is sequentially filtered toward a more downstream position.

The second collector 132 may be located at a lowermost downstream position of the collector 13.

The second collector 132 may comprise a second bracket 1321, a second pipe 1322 communicating with the second bracket 1321, the second membrane 1324 connected to the second bracket 1321, and a second receiver 1323 coupled to the second bracket 1321.

The second bracket 1321 may be provided to have a vertical pipe shape, as shown in FIG. 3, and may be connected to the second pipe 1322 at least a side of the second bracket 1321.

The second pipe 1322 receives the second air 103 from the first collector 131 adjacent to the second pipe 1322.

The second membrane 1324 may be coupled to an end, for example, an upper end portion, of the second bracket 1321 and may filter the second powder 102 as the second air 103 passes through the second membrane 1324. An air pore size and a porosity of the second membrane 1324 may be determined based on a desired boron particle size.

The second receiver 1323 may be coupled to the other end, for example, a lower end portion, of the second bracket 1321 and may receive the second powder 102 filtered by the second membrane 1324. Although not shown in FIG. 3, a filter and/or a mesh may be further provided between the second receiver 1323 and the second bracket 1321 to prevent powder received in the second receiver 1323 from entering back to the second membrane 1324.

Although the second collector 132 does not include a collecting container in FIG. 3, the present disclosure is not limited thereto. According to another embodiment, the second bracket 1321, the second membrane 1324, and the second receiver 1323 may be received in a collecting container, and air received in the collecting container may be discharged by an additional ejector.

Accordingly, the second powder 102 in the second air 103 may be filtered by sequentially passing through the first collector 131 and the second collector 132, and the second powder 102 with the smallest diameter may be received in the second receiver 1323 that is located at a last position.

The first membrane 1314 and/or the second membrane 1324 may be replaced, for example, with membranes having a pore size and a porosity suitable to obtain the second powder 102 with a desired diameter.

The second powder 102 may comprise catalyst particles with a large diameter that are not nano-sized in a nano-sizing process and/or are not filtered in a collecting process.

The catalyst particles with a large diameter may act as impurities of finally obtained BNNTs, thereby reducing purity. It is preferable to remove particles with a diameter greater than 1,000 nm. Accordingly, a purification process of removing catalyst particles with a large diameter may be performed.

In the purification process, nanopowder formed by an air jet and/or an eddy may be dispersed in a solvent, catalytic powder with a large diameter in a dispersed solution may be separated by using a magnet, and high purity boron-based nano precursor powder from which catalyst particles with a large diameter are removed may be obtained by collecting and drying a supernatant of the dispersed solution.

The purification process may be performed using a centrifugal force, instead of the magnet. For example, catalytic powder with a large diameter may be removed at 500 to 2,000 rpm by using a centrifugal separator.

The purification process may be performed at low costs, and does not increase process costs. In this case, although the solvent is not limited, it is preferable that the solvent does not act as impurities during preparation of BNNTs. Accordingly, it is preferable that the solvent is easily removed after the purification process, and preferable examples of the solvent may comprise ethanol and water. It is more preferable that ethanol is used as the solvent by taking into account efficiency in drying a supernatant.

In forming of the precursor disk S2, the collected second powder may be shaped into a precursor disk. Since the second powder is shaped into a precursor disk and undergoes a reaction process, reaction yield may be increased and mass-production may be ensured.

To this end, the precursor disk may be formed by mixing a binder that does not act as impurities during preparation of BNNTs with the second powder that is precursor powder to obtain a mixture and heating and/or pressing the mixture at an appropriate temperature.

The precursor disk may be prepared according to a method of an embodiment, and BNNTs may be prepared by heat treating the precursor disk. Accordingly, the precursor disk does not have to have a high combination force or high shape stability as long as the precursor disk may maintain a shape thereof at a temperature and pressure in a reaction chamber.

The binder may comprise sucrose, treacle, grain syrup, polypropylene carbonate (PPC), a vinyl-based material such as polyvinyl alcohol (PVA) or polyvinyl butyral (PVB), and a cellulose-based material such as ethyl cellulose (EC). Since the binder vaporizes and is removed in a high-temperature heat treatment process of firing and nitriding the second powder that is precursor powder, the binder does not remain in BNNTs and does not act as impurities.

A binder content may range from about 5 wt % to about 50 wt % based on 100 wt % of the precursor powder. When the binder content is less than 5 wt %, it may not be easy to shape powder into a disk and it may be difficult to maintain a shape of the precursor disk. When the binder content is greater than 50 wt %, pores are formed in a film after a binder component vaporizes and is removed. In this case, too many pores may reduce the reliability of the precursor disk.

The precursor disk may be formed on a separative film, for example, a release film. For example, a release film may be inserted into a mold, mixed powder of precursor powder and binder powder may be uniformly distributed on the release film, and the precursor disk having a predetermined shape may be prepared by pressing the mixed powder. Preferably, the release film may be removed and then the precursor disk may be put in a heat treatment chamber.

In this case, the binder may be used in a powder state or a liquid state.

Any binder that may be used in a powder state from among components that may be appropriately used as the binder may be appropriately used in the present disclosure as long as the binder has a solid state at room temperature. Examples of the binder that may be used in a powder state may comprise sucrose, treacle, grain syrup, PPC, a vinyl-based material such as PVA or PVB, a cellulose-based material such as EC, and a resin such as epoxy.

When the binder is used in a powder state, in order to form the precursor disk, the precursor powder and binder powder is mixed to obtain mixed powder, the mixed powder is uniformly distributed and then is pressed at an appropriate temperature to prepare the precursor disk. In detail, the precursor disk may be prepared by uniformly distributing the mixed powder in a mold in which the mixed powder may be shaped into a predetermine disk, pressing the mixed powder by using a hot pressing process at a predetermined temperature to increase a viscosity of the binder powder, and inducing adhesion of the precursor powder.

In this case, a temperature of the hot pressing process may range from about 50° C. to about 150° C. When the temperature is lower than 50° C., adhesion due to a viscosity of the binder powder may not be ensured, and when the temperature is higher than 150° C., the binder powder may melt or vaporize and thus it may not be easy to release a film or perform shaping.

When the binder is used in a liquid state, a disk may be simply formed by mixing the precursor powder with a liquid binder to obtain a mixture, uniformly distributing the mixture on a release film, applying heat to a predetermined temperature, and pressing and drying the mixture.

In this case, the liquid binder may be obtained by applying water to a binder such as sucrose, treacle, grain syrup, or PVA.

The liquid binder may be obtained by applying a solvent to a binder such as PPC, PVB, or EC. In this case, the solvent may be appropriately selected according to a type of a binder. Ketone or ethyl acetate may be used for PPC, methanol or ethanol may be used for PVB, and terpinol may be used for EC.

Alternatively, the precursor disk may be formed by distributing a mixture of the precursor powder and a binder on a predetermined substrate and then pressuring and/or heating the mixture, and the substrate on which the precursor disk is formed may be put in a reaction chamber. In this case, the precursor disk may be formed on a surface or both surfaces of the substrate. The precursor disk may be formed by applying the mixture on the substrate in the same manner as that described for a case where a disk is formed on a release film.

In this case, it is preferable that the substrate is formed of a material that may withstand heat treatment at a high temperature because the substrate may be located in a heat treatment chamber. Accordingly, the substrate may be formed of, for example, a metal such as stainless steel (STS), tungsten (W), or titanium (Ti), or ceramic such as silicon carbide or alumina.

It is preferable that the precursor disk is thin by taking into account reaction efficiency with nitrogen in a reaction chamber. However, it is preferable that the precursor disk is thick by taking into account shape stability for maintaining a shape of the precursor disk in the reaction chamber. In particular, a binder used in preparation of the precursor disk vaporizes in a heat treatment process, and thus pores are formed in the precursor disk during the heat treatment.

For example, when sucrose is used as a binder, a thermal decomposition process may be defined by using the following chemical formula.

$$C_{12}H_{22}O_{11}(\text{Sucrose}) + \text{heat} \rightarrow 3CO_2 + 5H_2O + 6H_2$$

The pores may affect shape stability of the precursor disk, thereby deforming the precursor disk. Accordingly, the precursor disk may have a thickness that is equal to or greater than 100 μm.

When a thickness of the precursor disk is too large, reaction efficiency may be reduced to the large thickness. However, since a transmittance of a reactive gas may be increased due to pores formed during vaporization of a binder component, BNNT preparation yield may be improved. As a result, a decrease in reaction efficiency due to a large thickness may be offset by pores. However, a thickness of the precursor disk may not exceed 1,000 μm.

In growing of the BNNTs S3, BNNTs are grown by heat treating the precursor disk.

The BNNTs may be grown by locating the precursor disk in a heating zone of a reaction chamber, heating the heating zone, and applying a reactive gas to the heating zone.

In this case, the precursor disk may be located in the reaction chamber so that the reactive gas may contact the precursor disk as much as possible. For example, the precursor disk may be vertically located in a reaction chamber with a horizontal cylindrical shape, that is, in a direction perpendicular to a bottom surface of the horizontal cylindrical reaction chamber. Since the precursor disk is vertically located, a plurality of the precursor disks may be located in the reaction chamber, thereby mass-producing BNNTs by using one heat treatment process. Also, since the precursor is formed as a thin film, a nitrogen-containing reactive gas may contact both surfaces of the precursor disk, thereby increasing a reaction area and increasing BNNT production yield.

A vertical arrangement of the precursor disk in the reaction chamber with the horizontal cylindrical shape is not limited, and may be appropriately selected by taking into account an inner shape of the reaction chamber, that is, reaction efficiency and efficiency in the use of an inner surface of the reaction chamber.

The reaction chamber is not limited as long as the reaction chamber is used to synthesize BNNTs. However, the reaction chamber may include a device for aligning the precursor disks.

Also, a nitrogen-containing reactive gas may be applied into the reaction chamber to prepare BNNTs from the precursor disk located in the reaction chamber. In this case, the reaction chamber may include a reactive gas distributor in order to distribute the nitrogen-containing reactive gas. The reactive gas distributor may apply the reactive gas to the precursor disk in a direction perpendicular or parallel to the precursor disk.

Although the reactive gas applied to the reaction chamber is not limited, nitrogen ($N_2$) or ammonia ($NH_3$) may be applied or a mixed gas of $N_2$ and $NH_3$ may be applied to the reaction chamber. Alternatively, a mixed gas of $N_2$, $NH_3$, and hydrogen ($H_2$) may be used.

The reactive gas may be applied to the reaction chamber at a speed ranging from about 20 sccm to about 500 sccm. When the reactive gas is applied at a speed less than 20 sccm, nitriding efficiency of boron may be reduced due to insufficient supply of nitrogen, and thus a reaction may need to be performed for a long time. When the reactive gas is applied at a speed greater than 500 sccm, boron powder in the precursor disk in a solid state may be ablated due to a high speed of the reactive gas, and thus BNNT production yield may be reduced.

BNNTs may be obtained by performing a heat treatment in the reaction chamber at a pressure equal to or less than 2 atm and a temperature ranging from about 1,100° C. to about 1,300° C. for 2 to 6 hours.

Figure 4:
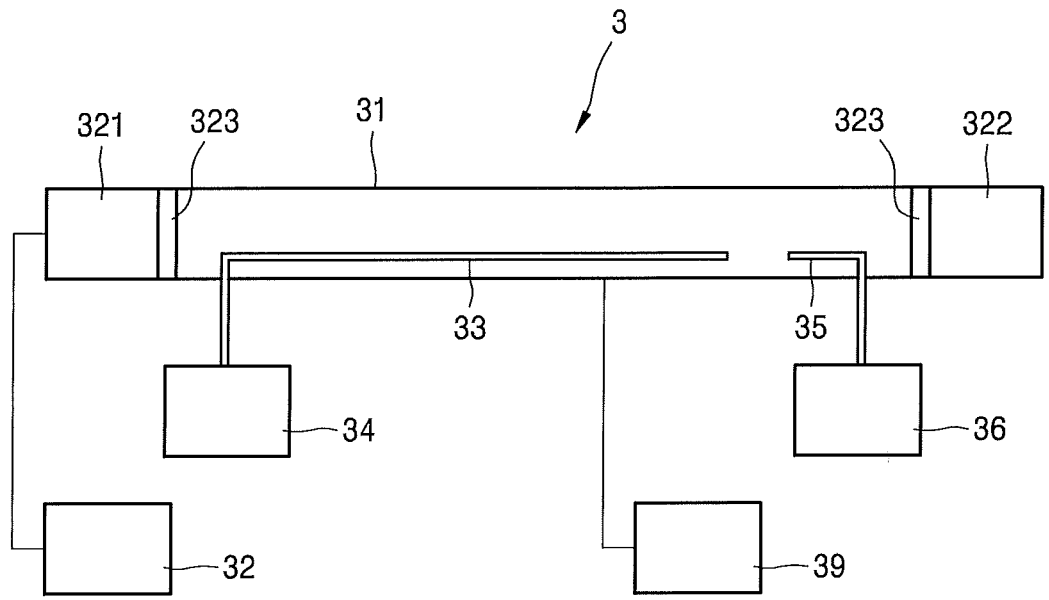
FIG. 4 is a side-sectional view of a heat treatment apparatus according to an embodiment.

According to an embodiment, a heat treatment apparatus 3 of FIG. 4 may be provided.

According to an embodiment, the heat treatment apparatus 3 may comprise a reaction chamber 31, a temperature controller 39, a vacuum processor 32, a gas supply pipe 33, and a gas supplier 34.

The reaction chamber 31, in which a precursor disk is received, may include a heating zone where an appropriate temperature for a reaction may be maintained. The reaction chamber 31 may include, but is not limited to, an alumina pipe, and may be formed of a heat-resistant material that may withstand a temperature of up to about 1,500° C.

A loading chamber 321 and an unloading chamber 322 may be respectively connected to a front end and a rear end of the reaction chamber 31, and gates 323 may be respectively provided between the reaction chamber 31 and the loading chamber 321 and between the reaction chamber 31 and the unloading chamber 322 to separate an environment in the reaction chamber 31.

The vacuum processor 32 may be connected to the reaction chamber 31 and may adjust a degree of vacuum in the reaction chamber 31. To this end, the vacuum processor 32 may comprise a vacuum pump and a controller. Although the vacuum processor 32 is connected to the loading chamber 321 in FIG. 4, the present disclosure is not limited thereto and the vacuum processor 32 may be connected to the unloading chamber 322.

The temperature controller 39 may be connected to the reaction chamber 31. Although not shown in FIG. 4, the temperature controller 39 may comprise a heater that directly adjusts a temperature in the reaction chamber 31 and a controller that controls the heater.

The gas supply pipe 33 may extend in the reaction chamber 31, and a reactive gas may be applied through the gas supply pipe 33 to at least the heating zone of the reaction chamber 31. Accordingly, the gas supply pipe 33 may have a length greater than that of the heating zone and may be provided to pass through the heating zone of the reaction chamber 31. A plurality of gas discharge holes may be formed in the gas supply pipe 33 so that a gas may be supplied through the gas supply pipe 33 into the reaction chamber 31.

The gas supply pipe 33 may extend along the reaction chamber 31.

The gas supply pipe 33 may be connected to the gas supplier 34 located outside the reaction chamber 31, and although not shown in FIG. 4, the gas supplier 34 may comprise a reactive gas storage tank and a gas supply pump.

According to an embodiment, a gas discharge pipe 35 may extend into the reaction chamber 31. The gas discharge pipe 35 may be located outside at least the heating zone of the reaction chamber 31. Accordingly, a reactive gas for which a reaction has been completed may be discharged to the outside of the reaction chamber 31 and pressure in the reaction chamber 31 may be prevented from excessively increasing.

The gas discharge pipe 35 may be connected to a gas discharge unit 36 located outside the reaction chamber 31, and although not shown in FIG. 4, the gas discharge unit 36 may comprise a valve for adjusting pressure in the reaction chamber 31 and a gas discharge pump.

Figure 5:
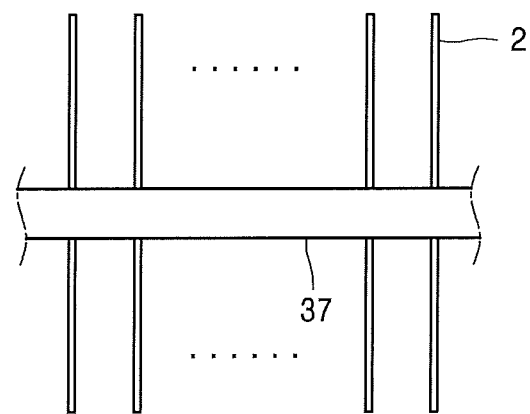
FIG. 5 is a partial side-sectional view illustrating a state where precursor disks are mounted on a rod according to an embodiment.
Figure 6:
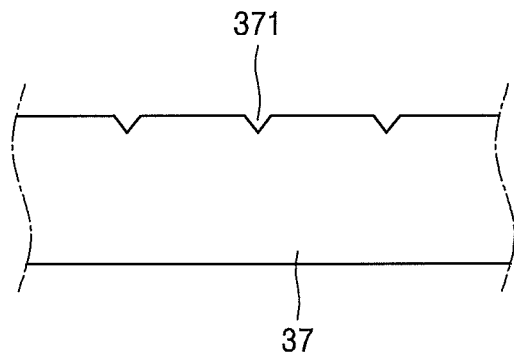
FIG. 6 is a partial side-sectional view of the rod according to an embodiment.

The precursor disk may be located in the reaction chamber 31. According to an embodiment, as shown in FIG. 5, a rod 37 may pass through a plurality of precursor disks 2, and the rod 37 may be located in at least the heating zone of the reaction chamber 31. The rod 37 may be located in a direction parallel to a longitudinal direction of the reaction chamber 31.

As such, according to an embodiment, BNNTs may be simultaneously synthesized and grown by allowing the rod 37 to pass through the plurality of precursor disks 2. Accordingly, since the whole reaction space in the reaction chamber 31 may be used, productivity and/or yield may be maximized.

The precursor disks 2 may be located on the rod 37 at predetermined intervals. The number of precursor disks 2 introduced into the reaction chamber 31 may be adjusted by adjusting an interval between the precursor disks 2.

A plurality of notches 371 may be formed in the rod 37 so that the precursor disks 2 are fixed to the rod 37 through the notches 371. Accordingly, an interval between the precursor disks 2 and/or the number of precursor disks 2 may be adjusted by adjusting an interval between the notches 371.

Figure 7A:
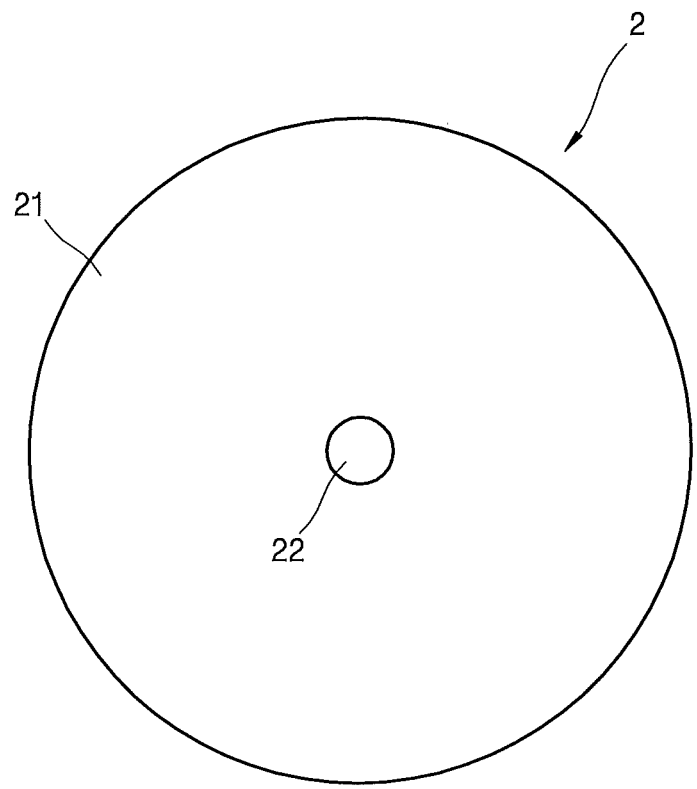
FIGS. 7A and 7B are plan views of the precursor disk according to embodiments.

The precursor disk 2 may be formed to correspond to a shape of an inner space of the reaction chamber 31. When the inner space of the reaction chamber 31 has a circular shape, a disk body 21 with a circular shape may be provided as shown in FIG. 7A. A loading hole 22 may be formed at a central portion of the disk body 21 and the rod 37 may pass through the loading hole 22.

A diameter of the disk body 21 of the precursor disk 2 may be less than an inner diameter of the reaction chamber 31.

Figure 7B:
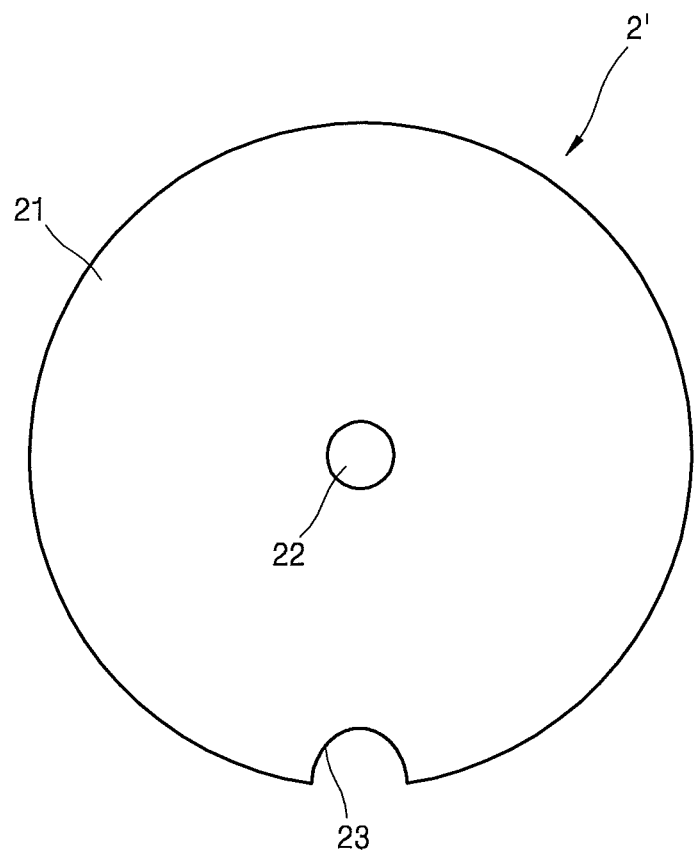

A precursor disk 2' according to another embodiment illustrated in FIG. 7B may further include a groove 23 formed in an edge portion of the disk body 21. When the gas supply pipe 33 is formed on a side of the reaction chamber 31, the disk body 21 may not interfere with the gas supply pipe 33 due to the groove 23.

Figure 8:
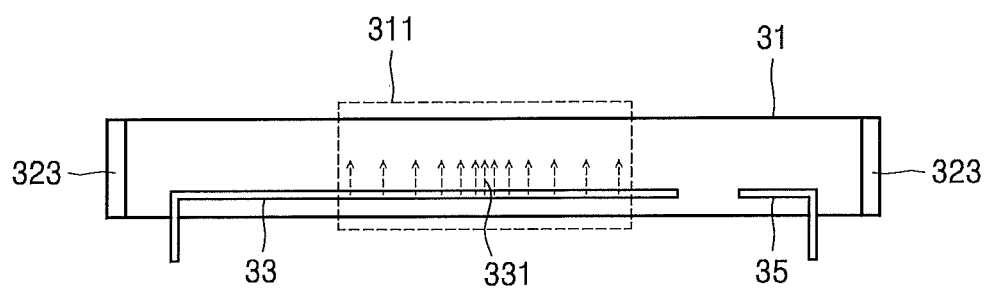
FIG. 8 is a side-sectional view illustrating a part of the heat treatment apparatus according to an embodiment.

A heating zone 311 may be located at a substantially central portion of the reaction chamber 31, as shown in FIG. 8, and a length of the heating zone 311 may be adjusted according to a capacity of the temperature controller 39 of the reaction chamber 31.

According to an embodiment, the supplying density of a reactive gas 331 supplied to the heating zone 311 may vary. That is, a large amount of reactive gas 331 may be applied to a middle portion of the heating zone 311 where a reaction most actively occurs and a smaller amount of reactive gas 331 may be applied to portions other than the middle portion.

In this structure, BNNTs may be prepared in a continuous process as described below.

Figure 9:
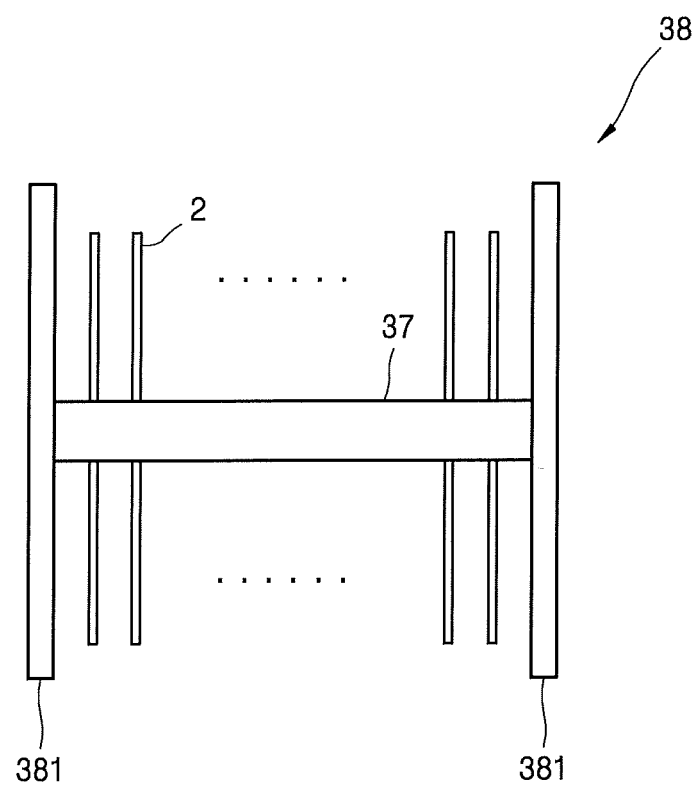
FIG. 9 is a side-sectional view of a cassette according to an embodiment.
Figure 10:
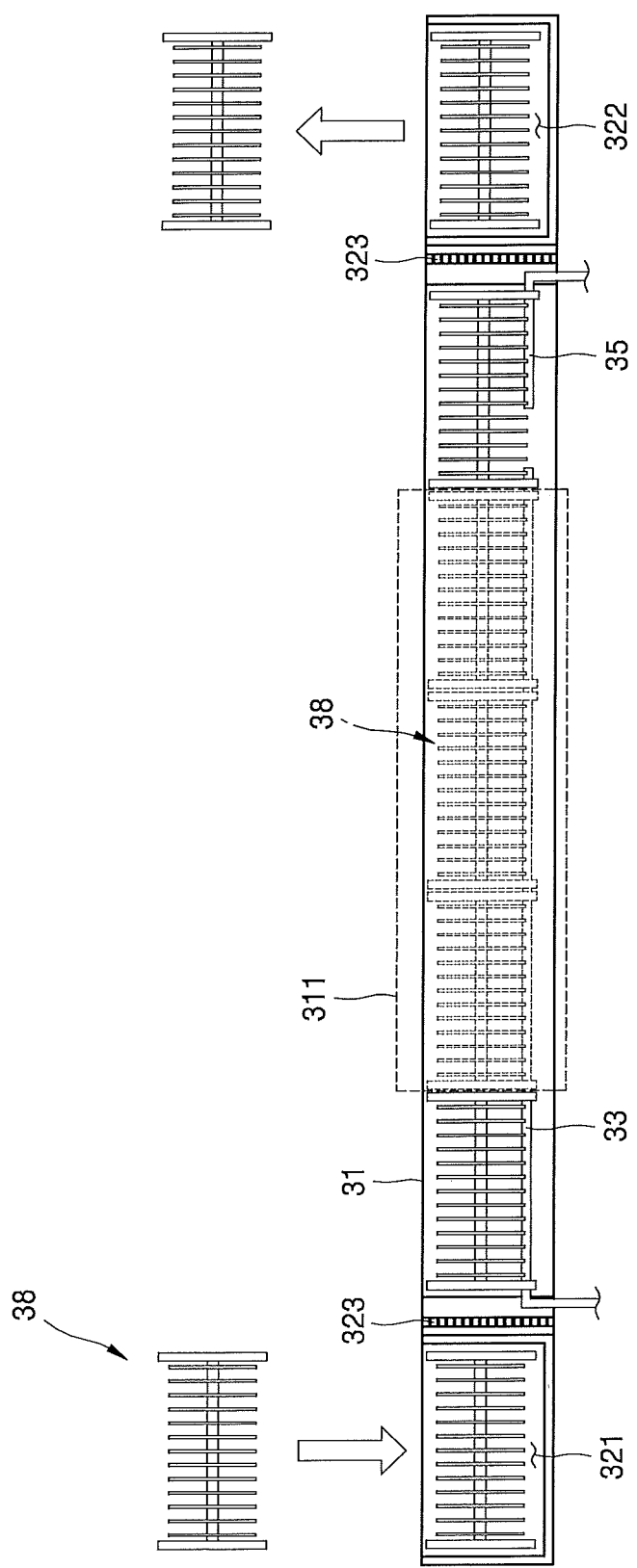
FIG. 10 is a side-sectional view of the heat treatment apparatus according to another embodiment.

According to an embodiment, to this end, as shown in FIG. 9, the precursor disks 2 may be received in a cassette 38, and as shown in FIG. 10, the precursor disks 2 may be continuously applied to the reaction chamber 31.

The reaction cassette 38 may comprise a pair of supports 381 facing each other and the rod 37 may be coupled between the supports 381. The supports 381 and the rod 37 may be detachably provided, and the precursor disks 2 may be arranged on the rod 37 as described above. The supports 381 may be formed of, but are not limited to, alumina that is a heat-resistant material.

Although not shown in FIG. 9, at least one hole may be formed in each of the supports 381. The hole may prevent pressure of a reactive gas in the reaction cassette 38 from being excessively maintained by the supports 381 and may appropriately maintain pressure of a reactive gas in the reaction chamber 31. The holes of the supports 381 may be symmetric with each other so that a reactive gas smoothly and uniformly flows in both directions.

The cassettes 38 may be continuously introduced into the reaction chamber 31, as shown in FIG. 10.

First, a temperature and a gas atmosphere in the reaction chamber 31 are optimized, and the cassette 38, in which the precursor disks 2 are received, is introduced through the loading chamber 321 into the reaction chamber 31. In this case, since the gate 323 is located between the loading chamber 321 and the reaction chamber 31, an atmosphere in the reaction chamber 31 may be maintained to the maximum and the cassette 38 may be received in the reaction chamber 31.

Although not shown in FIG. 10, an additional transfer device for transferring the cassette 38 to the reaction chamber 31, an auxiliary gate, and a vacuum pump may be provided in the loading chamber 321. In this case, when the gate 323 of the reaction chamber 31 is opened, the reaction chamber 31 and the loading chamber 321 operate at the same reactive atmosphere and the same pressure, the cassette 38 is transferred from the loading chamber 321 to the reaction chamber 31, and then the gate 323 is closed.

When the gate 323 is closed, the auxiliary gate of the loading chamber 321 is opened, a new cassette 38 is introduced, the auxiliary gate is closed, and the new cassette 338 is transferred to the reaction chamber 31 as described above. During this operation, the loading chamber 321 prevents the precursor disks 2 of the cassette 38 from being contaminated by using the auxiliary gate and the vacuum pump and makes an atmosphere in the loading chamber 321 similar to that in the reaction chamber 31.

The cassettes 38 may be sequentially transferred toward the unloading chamber 322 in the above manner and may be horizontally stacked in the reaction chamber 31.

Next, when the gate 323 is opened, the cassette 38 may be moved to the unloading chamber 322, and when the gate 323 is closed, the cassette 38 may be ejected from the unloading chamber 322.

In this process, the amount of a reactive gas that is supplied may be adjusted as shown in FIG. 9 so that a reaction with the reactive gas may most actively occur when the cassette 38 is located at a central portion of the heating zone 311.

When BNNTs are grown by heat treating powder by using a generally known method, processes of increasing a temperature, maintaining the temperature, synthesizing BNs, growing BNNTs, decreasing a temperature, cooling at room temperature, and removing a reactant have to be performed, there is a limitation in volume of one time production of BNNTs, and cost increases due to increase in required energy and time.

However, according to an embodiment, since BNNTs are continuously prepared in an in-line manner by using the above method, BNNT preparation yield and productivity may be maximized.

A method of preparing BNNTs according to an embodiment will now be explained in more detail. However, the present disclosure is not limited thereto.

In order to prepare a nano boron precursor for BNNT synthesis, amorphous boron powder that had a magnesium (Mg) impurity content of about 3.5 wt % and a mean diameter of 5 μm and iron (Fe) powder that was a metal catalyst and had a mean diameter of about 50 nm were mixed together to form first powder. The first powder comprised 4 g of amorphous boron and 0.4 g of iron (Fe). Next, an operation may be performed for 5 minutes with first air accelerated by using, for example, the first powder nano-sizing apparatus 1 of FIG. 2, to prepare boron precursor nanopowder, that is, second powder.

6 g of nano-sized and collected boron precursor nano powder and 4 g of finely grinded sucrose were uniformly mixed together to form a mixture, and the mixture was applied by using a mesh having fine pores to be uniformly distributed between a donut-shaped mold with a thickness of 150 μm and a release film and then was pressed by using a hot pressing process at 150° C. to prepare a disk with a thickness of 150 μm.

Donut-shaped precursor disks shaped as shown in FIG. 7A were loaded on a rod and put in a heat treatment chamber, as shown in FIG. 5.

Next, a mixed gas of $N_2$ (90 vol %) and $NH_3$ (10 vol %) was heat treated at a flow rate of 200 sccm at 1,200° C. for 4 hours to obtain BNNTs.

Figure 11A:
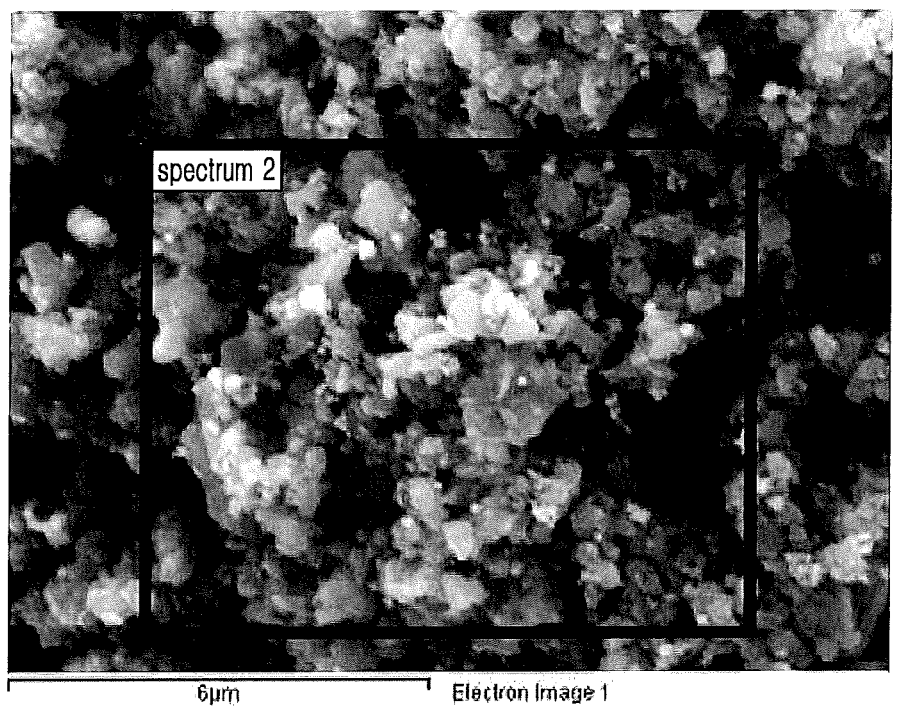
FIG. 11A is a scanning electron microscopy (SEM) image illustrating a shape of nano-sized boron nanopowder.
Figure 11B:
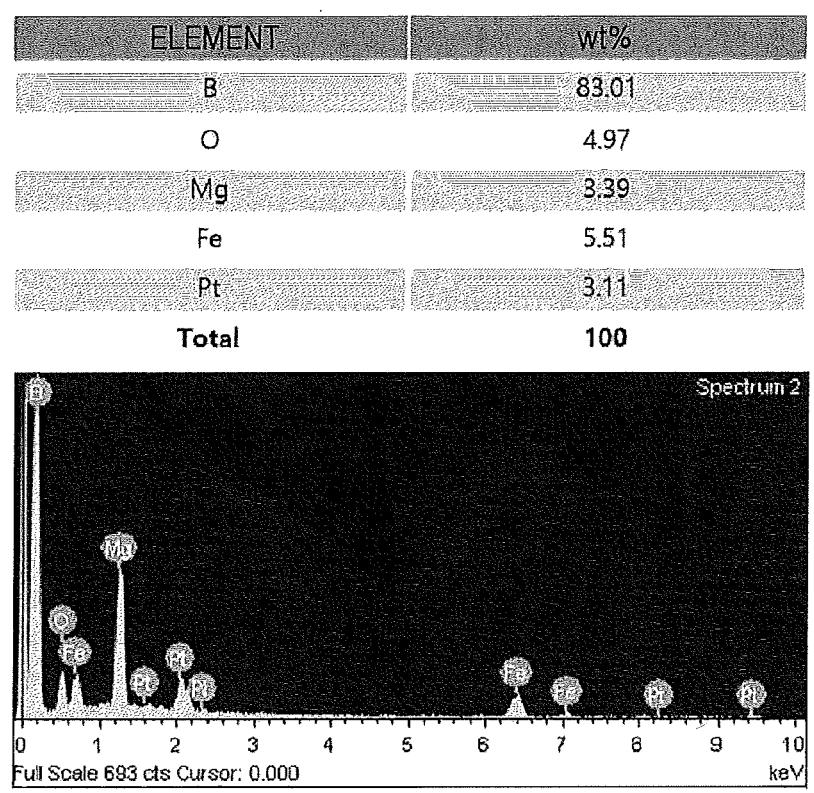
FIG. 11B is a graph showing a result of energy dispersive spectroscopy (EDS) performed on the boron nanopowder.

FIG. 11A is a scanning electron microscopy (SEM) image illustrating a shape of nano-sized boron nanopowder. Boron particles with a nano size diameter were dispersed in agglomerates. FIG. 11B is a graph showing a result of energy dispersive spectroscopy (EDS) performed on a quadrangular portion (see FIG. 11A) of the boron nanopowder obtained through the nano-sizing process. A boron (B) content was about 83.01 wt %, an iron (Fe) content was about 5.51 wt %, a magnesium (Mg) content was about 3.39 wt %, an oxygen (O) content was about 4.91 wt %, and a platinum (Pt) content was about 3.11 wt %. Mg that already existed as impurities in amorphous boron powder and may perform as a catalyst like Fe was dispersed in an appropriate amount. It is found from FIG. 11B that catalytic metal nanoparticles were embedded in the boron nanoparticles prepared by using a nano-sizing process using an eddy of air of the present disclosure to obtain an efficient seed for synthesis and growth of nanotubes.

Figure 12:
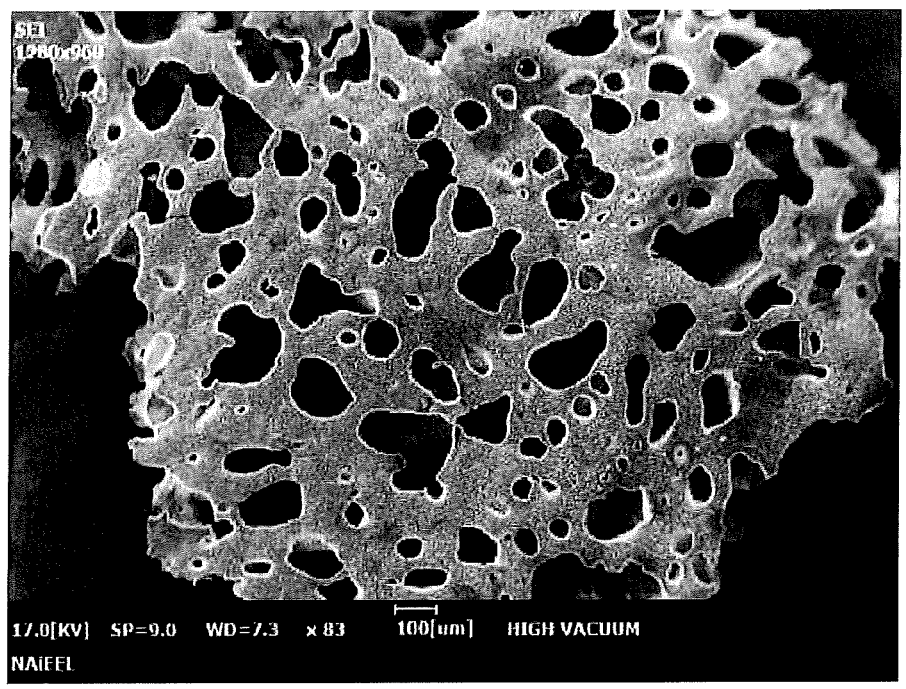
FIG. 12 is a low-resolution SEM image of a disk plane after a heat treatment process on a precursor disk.

FIG. 12 is a low-resolution SEM image of a disk plane after a heat treatment process on a precursor disk. A binder was removed from the precursor disk and a sufficient number of pores were formed. Accordingly, a reactive gas may pass through the entire precursor disk and a reaction may efficiently occur.

Figure 13:
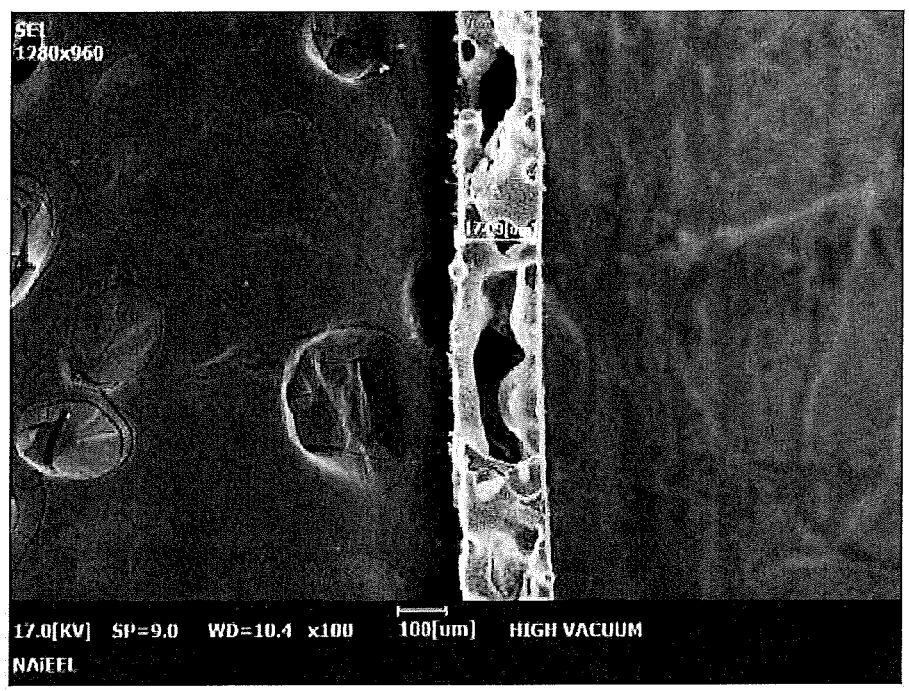
FIG. 13 is a low-resolution SEM image of a disk section after a heat treatment process on a precursor disk.

FIG. 13 is a low-resolution SEM image of a disk section after a heat treatment process on a precursor disk. Referring to FIG. 13, BNNTs were grown in the precursor disk to a thickness of about 150 μm.

Figure 14:
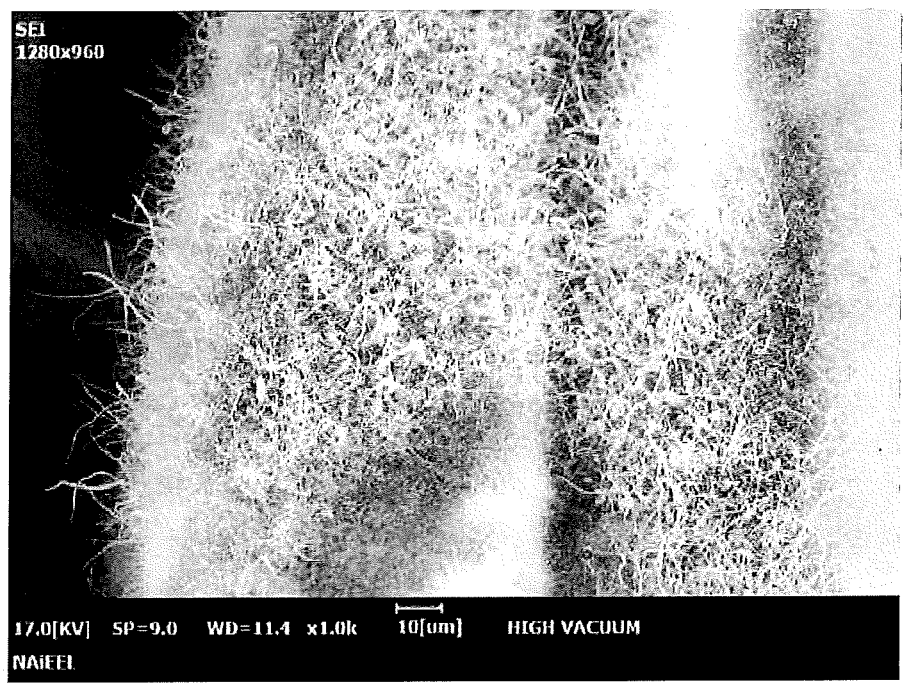
FIG. 14 is a high-resolution SEM image of a disk section after a heat treatment process on a precursor disk.

FIG. 14 is a high-resolution SEM image of a disk section after a heat treatment process on a precursor disk. Referring to FIG. 14, BNNTs were grown in the precursor disk. As described above, pores may be formed in the precursor disk when a binder included in the precursor disk disassociated and/or evaporated, and thus a reactive gas may pass through the precursor disk.

Figure 15:
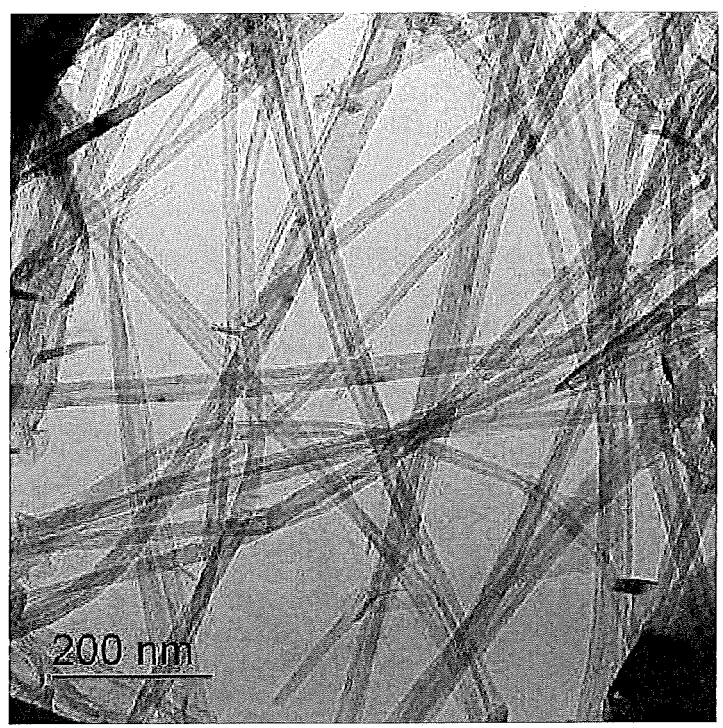
FIG. 15 is a transmission electron microscopy (TEM) image of BNNTs prepared by performing a heat treatment process on a precursor disk.

FIG. 15 is a transmission electron microscopy (TEM) image of BNNTs prepared by performing a heat treatment process on a precursor disk. Referring to FIG. 15, nanotubes with a mean diameter of 50 nm or less were grown straight and long.

Figure 16A:
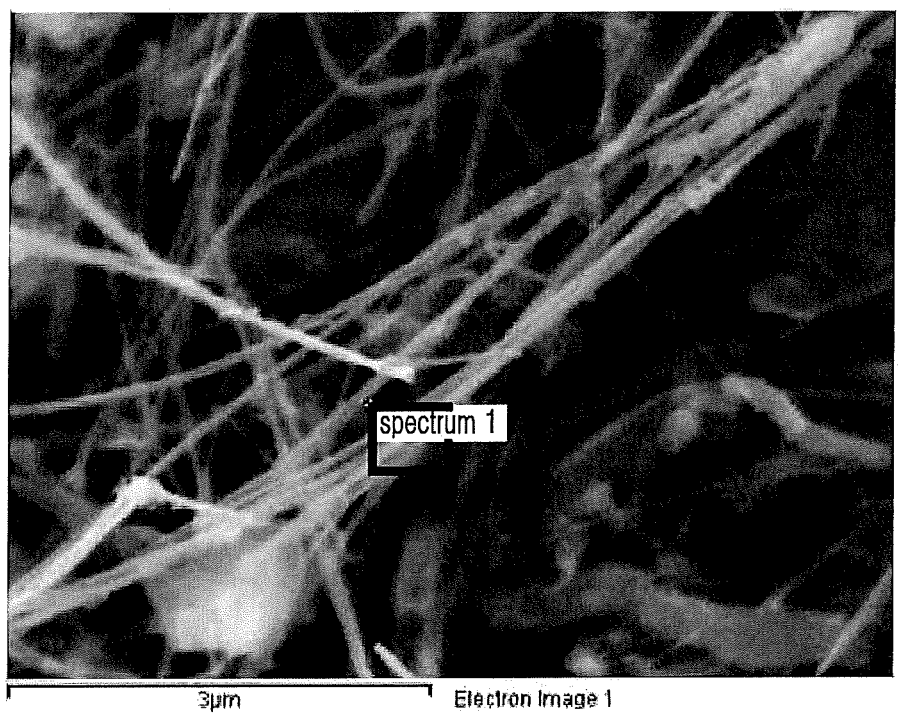
FIGS. 16A and 16B are respectively an SEM image of prepared BNNTs and a graph showing an EDS result.
Figure 16B:
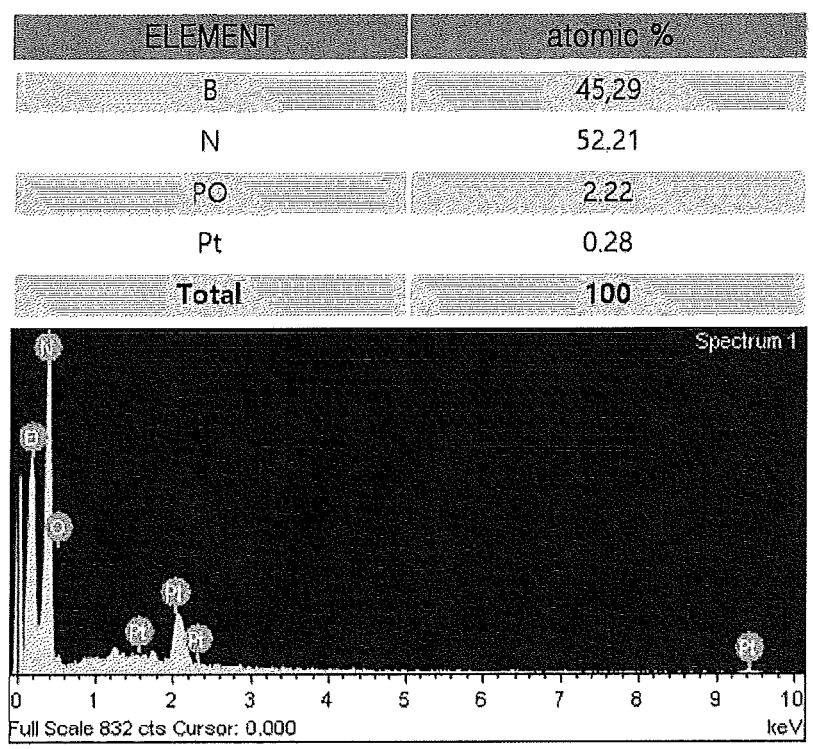

FIGS. 16A and 16B are respectively an SEM image of prepared BNNTs and a graph showing an EDS result. As shown in FIG. 16B, BNNTs of which the ratio between nitrogen and boron was about 1:1 were formed and had a degree of purity of about 97.5%.

A method and apparatus for preparing BNNTs according to the one or more embodiments may ensure mass-production, may increase yield by reducing a production time, and may prepare BNNTs with high purity.

While the present disclosure has been particularly shown and described with reference to exemplary embodiments thereof, it will be understood by one of ordinary skill in the art that various changes in form and details may be made therein without departing from the spirit and scope of the present disclosure as defined by the following claims.

The particular implementations shown and described herein are illustrative examples of the present disclosure and are not intended to otherwise limit the scope of the present disclosure in any way. For the sake of brevity, conventional electronics, control systems, software development, and other functional aspects of the systems may not be described in detail. Furthermore, connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the present disclosure unless the element is specifically described as "essential" or "critical".

The use of the terms "a" and "an", and "the" and similar referents in the context of describing the present disclosure (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Also, the steps of all methods described herein can be performed in any suitable order unless otherwise indicated herein or otherwise clearly contradicted by context. The present disclosure is not limited to the described order of the steps. The use of any and all examples, or exemplary language (e.g., "such as") provided herein, is intended merely to better illuminate the present disclosure and does not pose a limitation on the scope of the present disclosure unless otherwise claimed. Numerous modifications and adaptations will be readily apparent to one of ordinary skill in the art without departing from the spirit and scope of the present disclosure.

What is claimed is:

1. An apparatus for preparing boron nitride nanotubes (BNNTs), the apparatus comprising:
   a container comprising a round nano-sizing area in which a first powder generated by mixing boron powder with a catalyst powder, is nano-sized to form a second powder;
   a first inlet through which the first powder is introduced into the nano-sizing area;
   a second inlet through which a first air is introduced to the nano-sizing area; and
   an outlet through which a second air having the second powder is discharged from the nano-sizing area;
   a first air injector connected to the second inlet and allowing the first air to be introduced into the nano-sizing area therethrough; and
   a collector connected to the outlet and including a membrane which collects the second power by allowing the second air to pass therethrough;
   wherein the second inlet is installed in a direction inclined to a perpendicular direction of the container; and
   wherein the first inlet is formed to form an acute angle towards a flow direction of the first air.

2. The apparatus of claim 1, further comprising:
   a reaction chamber having at least a heating zone, wherein the reaction chamber receives a precursor disk formed by mixing the second power with a binder.

3. The apparatus of claim 2, further comprising;
   a rod that passes through the precursor disk.

4. The apparatus of claim 3, further comprising:
   a temperature controller operable to adjust a temperature of the at least the heating zone.

5. The apparatus of claim 4, further comprising:
   a vacuum processor connected to the reaction chamber, wherein the vacuum processor is operable to adjust a degree of vacuum in the reaction chamber.

6. The apparatus of claim 5, further comprising:
   a gas supply pipe located in the reaction chamber, wherein the gas supply pipe is operable to apply a reactive gas to that at least the heating zone of the reaction chamber.

7. The apparatus of claim 6, further comprising:
   a reactive gas supplier connected to the gas supply pipe, wherein the reactive gas supplier is operable to apply the reactive gas to the gas supply pipe.

8. The apparatus of claim 2, further comprising a cassette that receives the precursor disk, wherein the cassette is located in the reaction chamber.

9. The apparatus of claim 8, wherein a rod passes through the precursor disk; and wherein the cassette comprises:
   a pair of supports facing each other and the rod is located between the pair of supports.

10. The apparatus of claim 1, wherein the first air injector comprises a compressed air storage tank and an air pump and the first air is a compressed high-speed air jet that is injected into the nano-sizing area.

11. The apparatus of claim 1, further comprising a gate that is opened to discharge the second air to the collector when nano-sizing ends.

12. The apparatus of claim 1, wherein the reaction chamber is formed of a heat-resistant material.

13. The apparatus of claim 12, wherein the heat resistant material is able to withstand a temperature of up to about 1,500° C.

14. The apparatus of claim 1, further comprising a loading chamber connected to a front end of the reaction chamber; and a gate provided between the loading chamber and the reaction chamber.

15. The apparatus of claim 1, further comprising an unloading chamber connected to a rear end of the reaction chamber; and a gate provided between the reaction chamber and the unloading chamber.

16. The apparatus of claim 1, wherein the collector comprises a plurality of the first collectors, and the number of the plurality of first collectors is selectively adjusted according to air pressure and an amount of the boron.

17. The apparatus of claim 1, wherein the collector comprises a bracket located in a collecting container, a pipe communicating with the bracket, wherein the membrane is connected to the bracket, and a receiver is coupled to the bracket.

18. The apparatus of claim 1, wherein the reaction chamber includes an alumina pipe.

19. The apparatus of claim 3, further comprising:
   a pair of supports facing each other and the rod is located between the pair of supports; and wherein at least one hole is formed in each support of the pair of supports and wherein the at least one hole in the pair of supports are symmetric with each other so that a reactive gas smoothly and uniformly flows in both directions.

20. The apparatus of claim 4, wherein the temperature controller comprises a heater that directly adjusts a temperature in the reaction chamber and a controller that controls the heater.

* * * * *